United States Patent [19]

Ibaraki

[11] Patent Number: 5,124,574
[45] Date of Patent: Jun. 23, 1992

[54] SEMICONDUCTOR DEVICE FOR GENERATING A VOLTAGE HIGHER THAN POWER SOURCE POTENTIAL OR LOWER THAN GROUNDING POTENTIAL

[75] Inventor: Akira Ibaraki, Takatsuki, Japan
[73] Assignee: Matsushita Electronics Corporation, Osaka, Japan
[21] Appl. No.: 602,407
[22] Filed: Oct. 22, 1990
[30] Foreign Application Priority Data
Oct. 21, 1989 [JP] Japan ................... 1-274514
[51] Int. Cl.$^5$ ............................................. H03K 3/01
[52] U.S. Cl. .................... 307/296.1; 307/296.2; 307/475; 365/189.09; 365/226
[58] Field of Search ................ 307/296.1, 296.2, 475; 365/189.09, 226

[56] References Cited

U.S. PATENT DOCUMENTS

| | | | |
|---|---|---|---|
| 3,962,591 | 6/1976 | Popka | 307/296.1 |
| 4,000,412 | 12/1976 | Rosenthal et al. | 307/296.1 |
| 4,628,214 | 12/1986 | Leuscher | 307/296.2 |
| 4,705,966 | 11/1987 | Van Zanten | 307/296.2 |
| 4,733,108 | 3/1988 | Truong | 307/296.2 |
| 5,023,465 | 6/1991 | Douglas et al. | 365/189.09 |

Primary Examiner—John S. Heyman
Assistant Examiner—Scott A. Ouellette
Attorney, Agent, or Firm—Ratner & Prestia

[57] ABSTRACT

The semiconductor integrated circuit of the invention comprises a circuit for generating a high voltage or a low voltage exceeding the voltage range between the power source potential and grounding potential, and a circuit for generating plural internal signals so as to reduce the time difference of the mutual transition timings among plural internal signals when the power source potential supplied from outside is raised, being composed so as to decrease the absolute value of the high voltage or low voltage by using the plural internal signals. In such a configuration, when an excessive power source potential close to the maximum rated potential exceeding the standard power source potential is supplied from outside, the absolute value of the high voltage or low voltage may be automatically reduced. As a result, malfunction or breakdown of gate oxide film due to application of an intense electric field in the PN junction may be securely prevented, so that the reliability of the semiconductor integrated circuit may be enhanced.

21 Claims, 12 Drawing Sheets

SEMICONDUCTOR DEVICE FOR GENERATING A VOLTAGE HIGHER THAN POWER SOURCE POTENTIAL OR LOWER THAN GROUNDING POTENTIAL

BACKGROUND OF THE INVENTION

The present invention relates to a semiconductor integrated circuit fabricated in a semiconductor device which generates a voltage higher than the power source potential or lower than the grounding potential.

In semiconductor devices, generally, circuits for generating higher voltage than the power source potential and circuits for generating lower voltage than the grounding potential are often incorporated into one device. For example, in a semiconductor memory circuit, it is necessary to supply a higher potential than the power source potential to the memory circuit as a data writing potential. On the other hand, in order to prevent abnormal phenomenon called latchup or decrease the floating junction capacity, substrate voltage generating circuit is often incorporated into the semiconductor integrated circuit, and a voltage lower than the grounding potential generated from the substrate potential generating circuit is supplied to the semiconductor substrate.

FIG. 13 shows a prior art semiconductor integrated circuit fabricated in a semiconductor device for generating a higher voltage than the power source potential for such purpose. It shows an example of a memory circuit. FIG. 14 is a timing chart showing the voltage waveforms of nodes A to E in FIG. 13.

The operation is described below according to FIGS. 13 and 14.

A clock signal generally known as $\overline{RAS}$ or chip enable signal is fed to an input terminal A. When the potential of the input terminal A becomes high level, MOS transistors Q21, Q23 are turned on by inverters i21, i23, while MOS transistor Q22 is turned off by an inverter i22. As a result, an output terminal B is connected to a power source potential Vcc through MOS transistor Q21 and diode d21. Ignoring the forward voltage drop of the diode d21, the potential of the output terminal B is lower than the power source potential Vcc by the threshold voltage (VTQI) of the MOS transistor Q21, that is, Vcc - VTQ1. This potential Vcc - VTQ1 is supplied to a memory cell 23 composed of a MOS transistor Q24 and a capacitor C22. At this time, for example, if the potential of a bit line BL is almost equal to the power source potential Vcc, data cannot be written stably into the capacitor C22.

In order to avoid such malfunction, the potential of the output terminal B is boosted to a higher potential than the power source potential Vcc by means of oscillation circuit 21 and charge pump circuit 22. The boosting operation is as follows. When the potential of the input terminal A becomes high level and the MOS transistor Q23 is turned on, the oscillation circuit 21 composed of inverters i24 to i26 and MOS transistor Q23 starts to oscillate, and an oscillation output varying between the power source potential Vcc and grounding potential 0V is obtained at an output node C. The potential of node D of the charge pump 22 is equal to the power source potential Vcc when the oscillation circuit 21 is stopped. Provided that, the forward voltage drop of the diode d23 is ignored. In this state, the oscillation circuit 21 starts oscillation, and when the power source potential Vcc at the node C is supplied to the node D through the capacitor C21 in the first oscillation period, the potential of the node D is ideally boosted to twice the power source potential Vcc, that is, 2Vcc. This potential 2Vcc is transmitted to the node E through diode D22, and the potential of the node E becomes 2Vcc, too. As a result, the potential of the output terminal B is also ideally boosted to 2Vcc - VTQ1. Thereafter the same operation is repeated in every oscillation period of the oscillation circuit 21, and the potential of the output terminal B is boosted to a potential higher than the power source potential Vcc. Actually, however, due to various leak currents in the semiconductor integrated circuit, the voltage after boosting is saturated at a certain value, and finally the potential of the output terminal B is held at a potential higher than the power source potential Vcc as shown in FIG. 14B. By supplying this boosted potential to the gate electrode of the MOS transistor Q24 of the memory cell 23, data can be written stably into the capacitor C22.

FIG. 15 shows a prior art semiconductor integrated circuit fabricated in a semiconductor device for generating a substrate voltage lower than the grounding potential. FIG. 16 is a timing chart showing the voltage waveforms of nodes X, Y, Z in FIG. 15.

The operation is described below by referring to FIG. 15 and FIG. 16.

Inverters j21 to j25 connected in a loop form compose a self-excited oscillation circuit, and an oscillation output varying between the power source potential Vcc and grounding potential 0V is obtained at the node X as shown in FIG. 16. A capacitor Ca21 and diodes D21, D22 compose a charge pump circuit.

Suppose the potential of the node Y is 0V. When the potential of the node X becomes the power source potential Vcc, the potential of the node Y is also going to become the power source potential Vcc through the capacitor Ca21. Since the diode D22 becomes conductive at this moment, the potential of the node Y remains at 0V, provided that the forward voltage drop of the diode D22 is ignored. At this time, the potential of the node Z, that is, the semiconductor substrate potential is also 0V. On the other hand, when the potential of the node X is changed from the power source potential Vcc to the grounding potential 0V, the diode D21 becomes conductive, thereby the potential of node X is made lower. As a result, the potential of the node Y is lowered to nearly −Vcc. At this time, the diode D22 is not conductive, and the potential of the node Y is nearly kept at −Vcc. Accordingly, through the diode D21, the potential of the node Z is stepped down from 0V to nearly -Vcc. Afterwards, the potential of the node X is gradually increased from near −Vcc toward 0V by the leak current flowing in the resistor r21. As the potential of the node X drops again to 0V in this process, the potential of the node Z is pulled down again to nearly Vcc by the same operation as mentioned above.

By repeating such operation, the potential of the node Z is maintained at an average potential VA lower than the grounding potential 0V. By supplying the potential VA to the semiconductor substrate as the substrate potential, it is possible to prevent latchup and decrease the junction capacity, thereby the stable operation and high speed operation of a semiconductor device can be achieved.

Thus, in the conventional semiconductor integrated circuit, it is attempted to stabilize the operation and realize the high speed operation, by generating a potential exceeding the power source potential or grounding potential, and supplying the potentials to specified nodes of the semiconductor integrated circuit.

Incidentally, the power source potential of a semiconductor integrated circuit is set within a range of about the standard power source potential (for example, 5V)±10%, and in addition to the standard power source potential, the maximum rated voltage (for example, 7V) is determined, and the operation is generally guaranteed when a power source potential within the maximum rated voltage is supplied. Practically, a supply voltage close to the maximum rated voltage may be applied when testing semiconductor integrated circuits fabricated in a semiconductor device, or a supply voltage close to the maximum rated voltage may be applied when using the semiconductor integrated circuit device in a special application. Moreover, due to some abnormal action, a supply voltage close to the maximum rated voltage may be applied to the semiconductor integrated circuit.

In the conventional semiconductor integrated circuit shown in FIG. 13 and FIG. 15, when a power source potential close to the maximum rated voltage (for example, 7V) exceeding the standard power source potential (for example, 5V) is supplied, the reliability of the semiconductor integrated circuit is lowered.

For example, in FIG. 13, while the standard power source potential (5V) is being supplied, the potential at the output terminal B is boosted to about 7V according to the action mentioned above, but when a excessive supply voltage close to the maximum rated voltage (7V) is applied, the potential at the output terminal B may be boosted nearly to 10 V by the same action. If such a high voltage is supplied to the gate electrode of the MOS transistor Q24, an intense electric field is applied to the PN junction, and the stability of the operation is sacrificed. Further when an intense electric field is applied to the gate oxide film, the gate oxide film may be broken.

A similar problem may also occur in FIG. 15. The reason is as follows. The pulse width of the oscillation output of the oscillation circuit composed of inverters j21 to j25 of FIG. 15 is determined by the sum of the delay time of the inverters j21 to j25. The delay time of each one of the inverters j21 to j25 depends on the amplitude of the power source potential, and the higher the power source potential, the faster the switching speed becomes, and thereby, the delay time becomes shorter. That is, the pulse width of the oscillation output is narrowed, and the oscillation frequency becomes higher. In response to such action, the potential of the node Z in FIG. 15 (that is, the substrate potential) becomes lower. In other words, when an excessive power source potential close to the maximum rated voltage is supplied, the voltage supplied from the substrate voltage generation circuit shown in FIG. 15 to the semiconductor substrate becomes even lower. Thus, when an excessive low voltage is supplied to the semiconductor substrate, an intense electric field is applied to the PN junction or gate oxide film of the MOS device in the semiconductor integrated circuit device, thereby the breakdown of the gate oxide film and other problems are induced.

The invention is to present a semiconductor integrated circuit for solving such conventional problems.

It is hence a first object of the invention to present a semiconductor integrated circuit incorporating a circuit for generating a higher voltage than a power source potential, in which if an excessive power source potential exceeding a standard power source potential is supplied from outside, the higher voltage is automatically restrained.

It is a second object of the invention to present a semiconductor integrated circuit incorporating a circuit for generating a lower voltage than a grounding potential, and supplying the lower voltage to a semiconductor substrate as the substrate voltage, in which if an excessive power source potential exceeding the standard power source potential is supplied from outside, the substrate voltage is automatically suppressed so as to prevent an excessively low voltage from being supplied to the semiconductor substrate.

It is a third object of the invention to present a semiconductor integrated circuit device incorporating a circuit for generating a higher voltage than the power source potential and a lower voltage than a grounding potential, in which if an excessive power source potential exceeding the standard power source potential is supplied from outside, the absolute value of the higher voltage or lower voltage is reduced.

SUMMARY OF THE INVENTION

The semiconductor integrated circuit of the invention comprises a circuit for generating a high voltage or a low voltage exceeding the voltage range between the power source potential and grounding potential, and a circuit for generating plural internal signal so as to reduce the time difference of the mutual transition timings among plural internal signals when the power source potential supplied from outside is raised, being composed so as to decrease the absolute value of the high voltage or low voltage by using the plural internal signals.

In such constitution, when an excessive power source potential close to the maximum rated potential exceeding the standard power source potential is supplied from outside, the absolute value of the high voltage or low voltage may be automatically reduced. As a result, malfunction or breakdown of gate oxide film due to application of an intense electric field in the PN junction may be securely prevented, so that the reliability of the semiconductor integrated circuit may be enhanced.

DETAILED DESCRIPTION OF THE INVENTION

Figure 1:
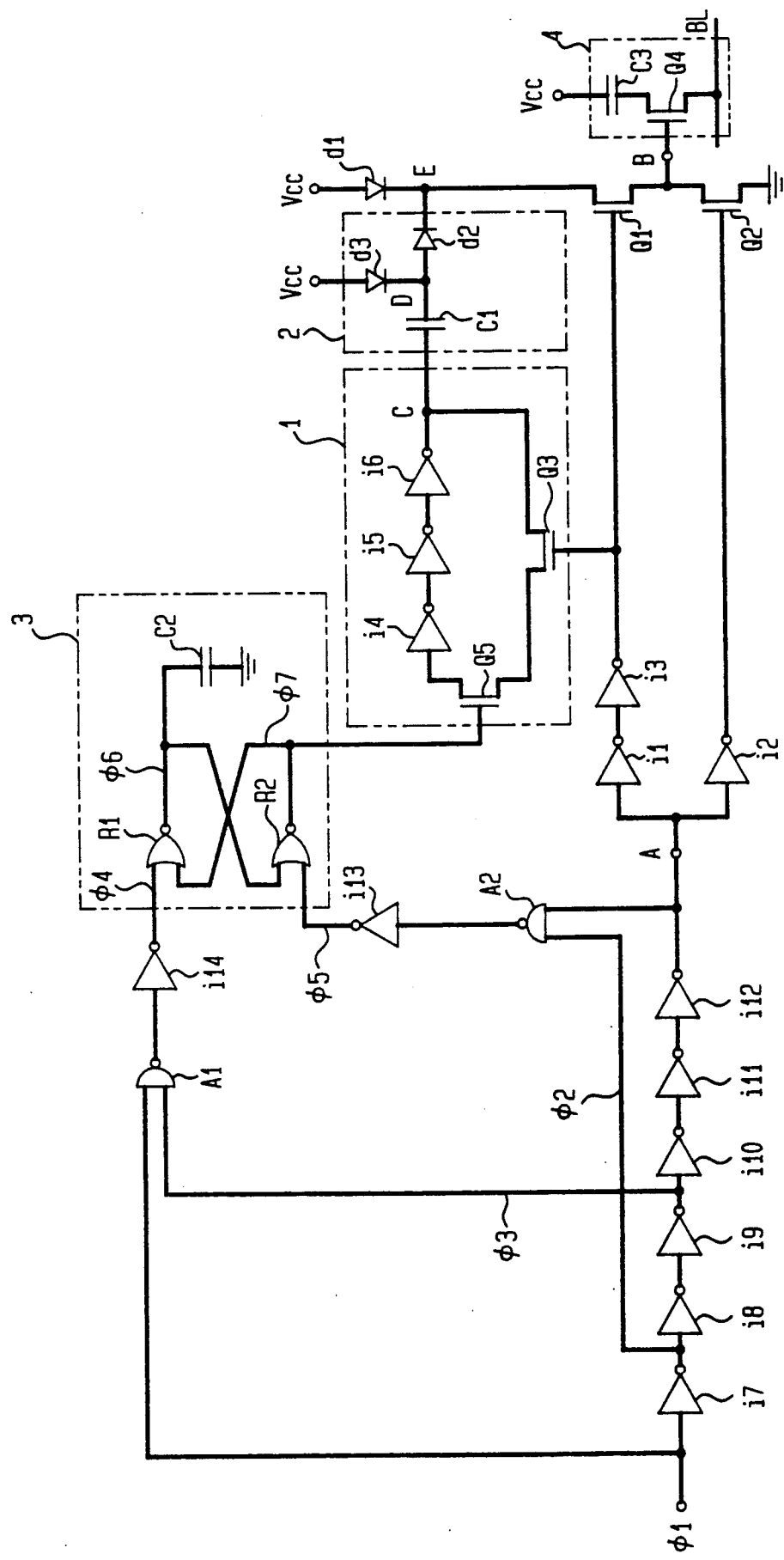
FIG. 1 is a circuit diagram of a semiconductor integrated circuit in a first embodiment of the invention.

Referring now to the drawings, some of the embodiments of the invention are described in detail below.

Figure 2:
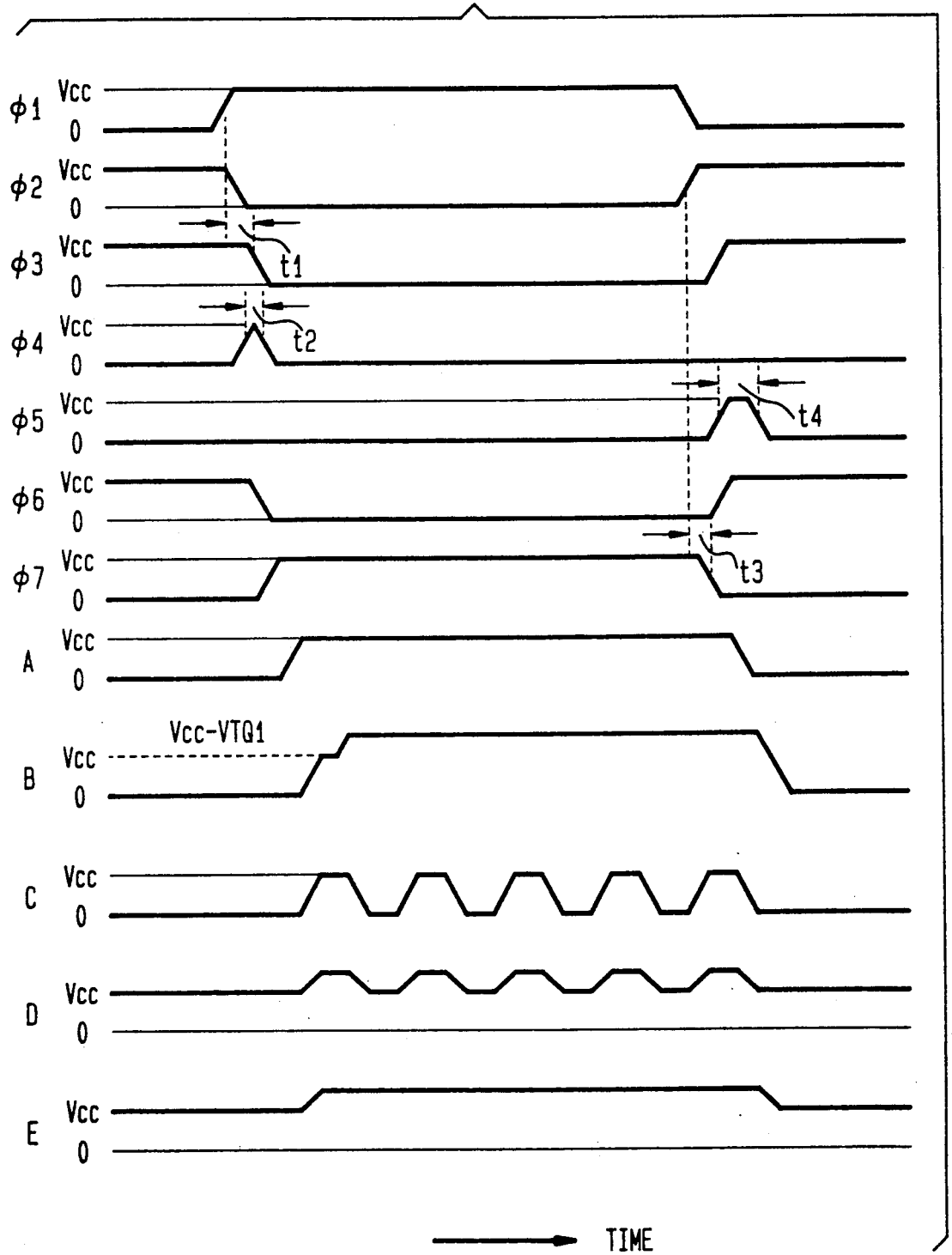
FIG. 2 is a timing chart showing voltage waveforms of nodes in FIG. 1 when the supply voltage is low.

FIG. 1 is a circuit diagram showing a semiconductor integrated circuit in a first embodiment of the invention. In a semiconductor memory circuit, FIG. 1 shows a high voltage generation circuit for generating a potential exceeding the power source potential. FIG. 2 is a timing chart showing voltage waveforms of nodes in FIG. 1.

The operation is explained while referring to FIGS. 1, 2.

Figure 13:
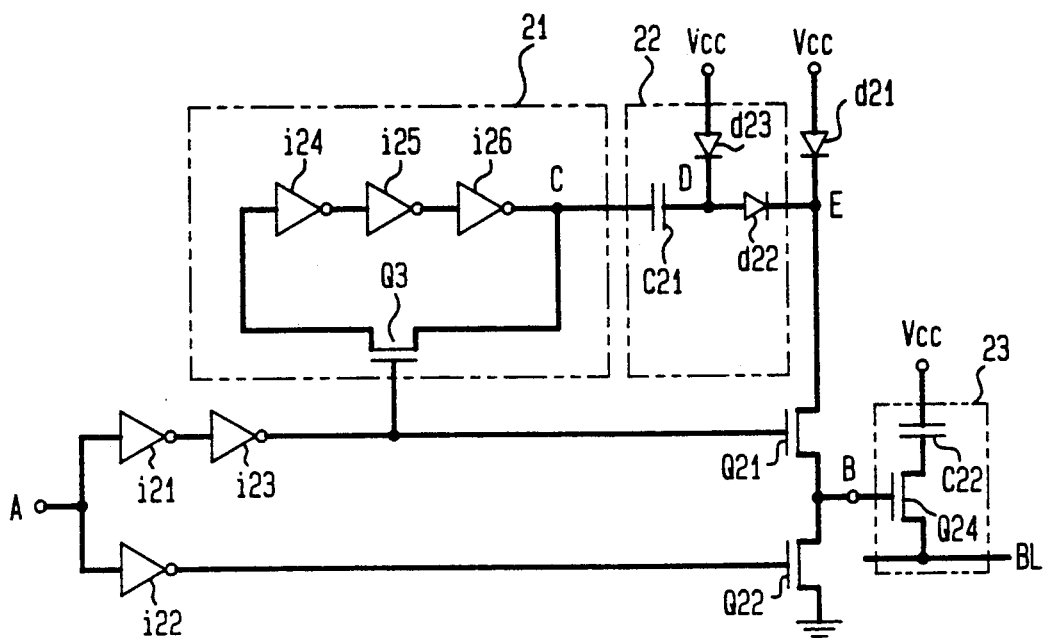
FIG. 13 is a circuit diagram showing a conventional semiconductor integrated circuit.
Figure 14:
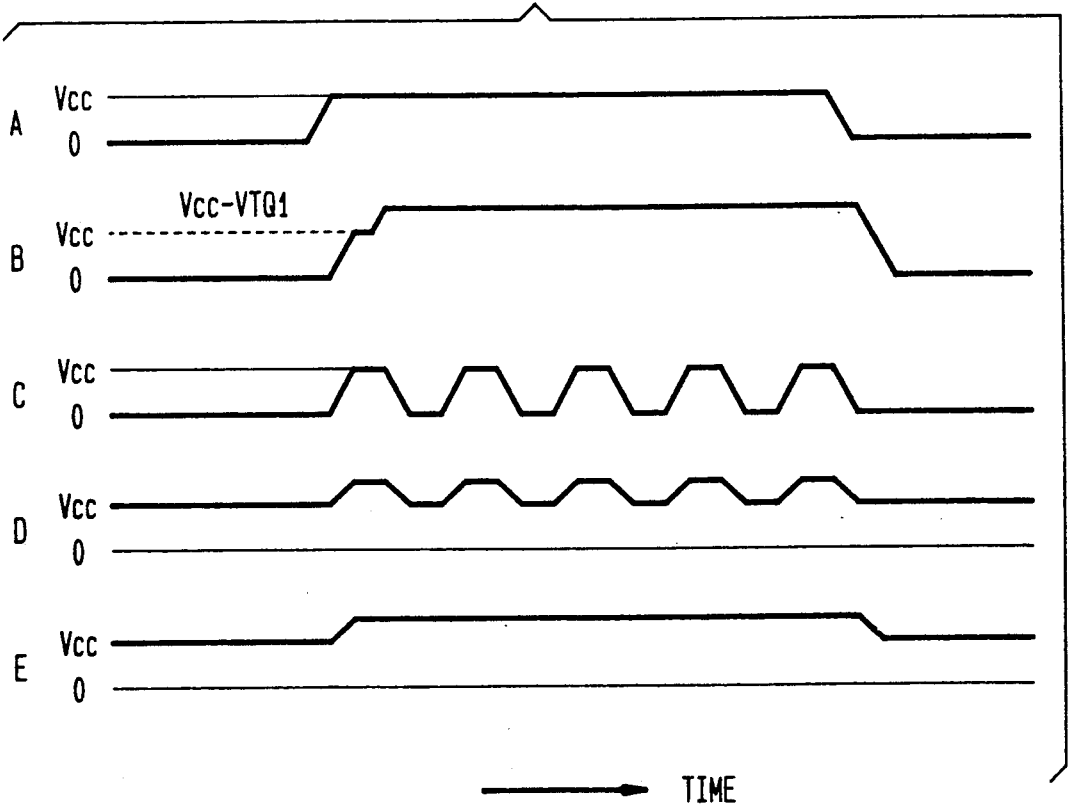
FIG. 14 is a timing chart showing voltage waveforms of nodes in FIG. 13.

In FIG. 1, the circuit after input terminal A is a circuit substantially equivalent to the conventional high voltage generation circuit shown in FIG. 13. A clock signal called $\overline{RAS}$ or chip enable signal is supplied to an input terminal $\phi1$. When the potential of the input terminal $\phi1$ becomes high level (that is, the power source potential Vcc), the output signal $\phi2$ of inverter i7 changes to low level (0V) in a delay of a certain time. Furthermore, in a delay of a certain time (t1 in FIG. 2) by inverters i8, i9, a signal $\phi3$ changes to low level. Signals $\phi i$ and $\phi3$ are supplied to NAND gate A1. The output of the NAND gate A1 is inverted by the inverter i14, and is supplied to one of the input terminals of the latch circuit 3 as a set signal $\phi4$. The set signal $\phi4$ has a pulse width of t2 as shown in FIG. 2. The latch circuit 3 is composed of cross-coupled two NOR gates R1, R2 and a capacitor C2. When the set signal $\phi4$ having a sufficient pulse width t2 is supplied to one of the input terminals of the latch circuit 3, the latch circuit 3 is set, and the output signal $\phi6$ of the NOR gate R1 becomes low level, and the output signal $\phi7$ of the NOR gate R2 changes to high level. When the output signal of the NOR o gate R2, that is, the output signal $\phi7$ of the latch circuit 3, becomes high level, the MOS transistor Q5 of the oscillation circuit 1 is turned on to be set in standby state.

On the other hand, the output signal of the inverter i9 is further delayed by inverters i10 to i12, changing from low level to high level (Vcc) in the timing shown in FIG. 2, and this signal is fed to the input terminal A.

When the potential at the input terminal A changes from low level to high level, as in the conventional high voltage generation circuit shown in FIG. 13, the MOS transistors Q1, Q3 are turned on by inverters i1, i3, and the MOS transistor Q2 is turned off by the invert i2, and the potential of the output terminal B becomes Vcc - VTQ1. On the other hand, as the MOS transistor Q3 is turned on (as stated above, the MOS transistor Q5 has been already turned on by the output signal $\phi7$ of the latch circuit 3), the oscillation circuit 1 composed of the inverters i4, i5 and MOS transistors Q3, Q5 starts its oscillation action, and an oscillation output as shown in FIG. 2 appears at node C. The node D of a charge pump 2 composed of capacitor C1 and diodes d2, d3 is pumped up, as in the prior art, by the oscillation output appearing at the node C, thereby boosting the potential at node E to a higher potential than the power source potential Vcc. As a result, the potential of the output terminal B goes up, thereby stabilizing data writing action into a memory cell 4.

This is the operation of the change of the potential of the input terminal $\phi$ from low level to high level.

Next is explained the operation when the potential of the input terminal $\phi1$ is changed from high level to low level. When the potential of the input terminal $\phi1$ changes from high level to low level, the output signal $\phi2$ of the inverter i7 changes from low level to high level in a delay of a certain time. On the other hand, the potential of the input terminal A changes from high level to low level in a delay time due to the inverters i7 to i12 after the potential of the input terminal $\phi1$ changes from high level to low level. The signal $\phi1$ and the potential of input terminal A are respectively supplied to two input terminals of NAND gate A2. The output of the NAND gate A2 is inverted by the inverter i13, and is supplied to the other input terminal of the latch circuit 3 as a reset signal $\phi5$. This reset signal $\phi5$ has a pulse width of t4 as shown in FIG. 2. As clear from FIG. 2, the pulse width t4 of the reset signal $\phi5$ is set to be broader than the pulse width t2 of the set signal $\phi4$. When the reset signal $\phi5$ having a sufficient pulse width t4 is supplied to the latch CO circuit 3, the output signal $\phi6$ of the NOR gate R1 changes to high level, and the output signal $\phi7$ of the NOR gate R2 changes to low level. That is, after the signal $\phi2$ changes from low level to high level, the output signal $\phi7$ of the latch circuit 3 changes from high level to low level in a delay time of t3. As a result, the MOS transistor Q5 is turned off, and the oscillation circuit 1 stops.

Figure 3:
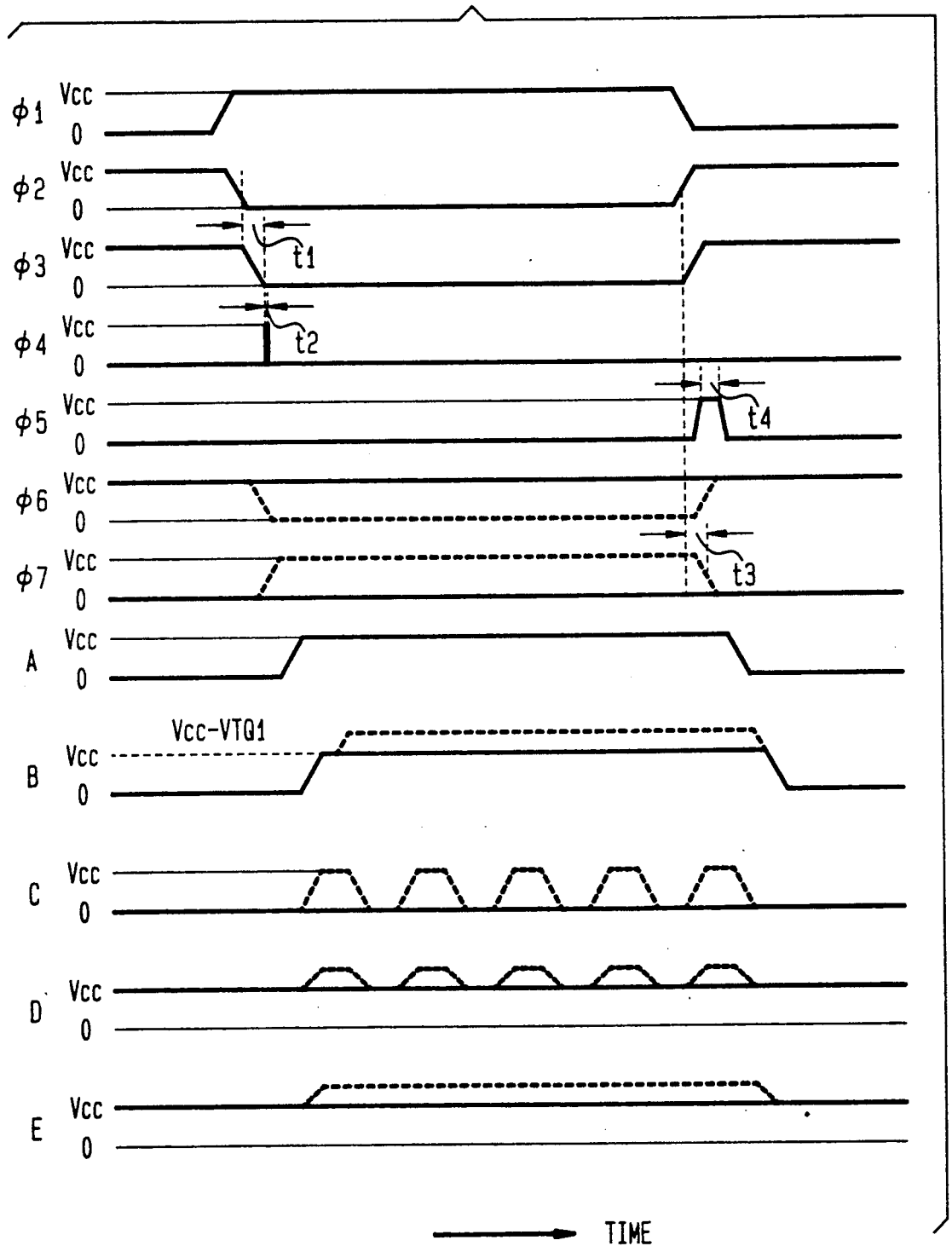
FIG. 3 is a timing chart showing voltage waveforms of nodes in FIG. 1 when the supply voltage is high.
Figure 4:
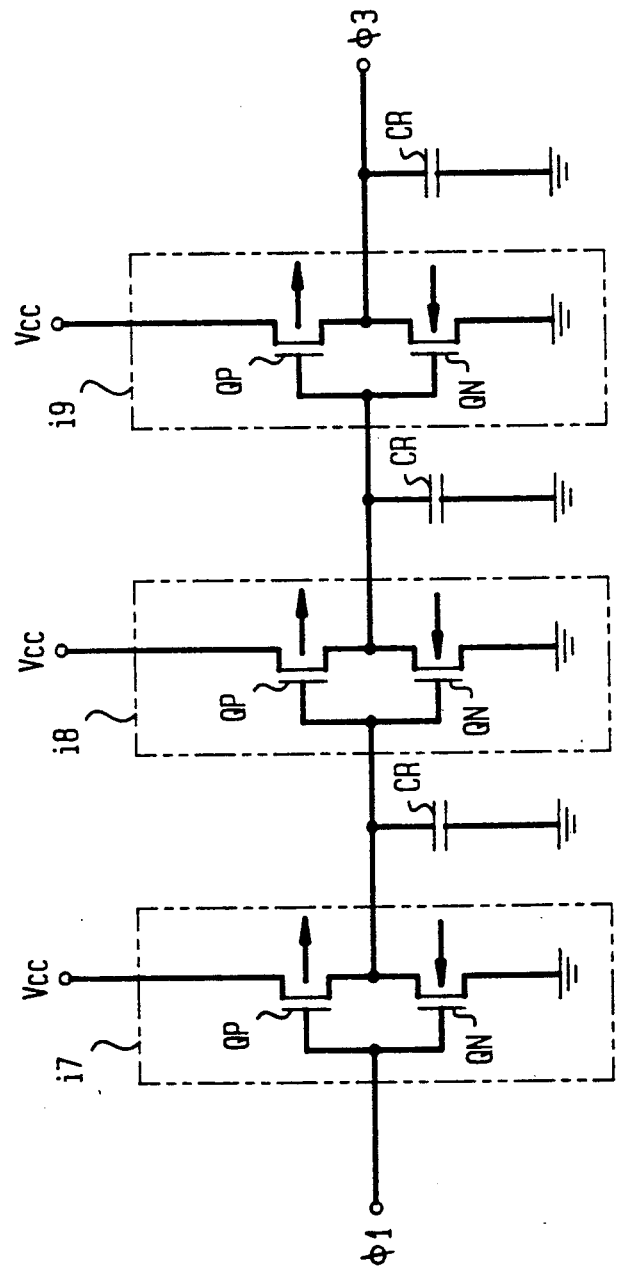
FIG. 4 is a circuit diagram for explaining the operation of the inverter.

On the other hand, in the high voltage generation circuit in FIG. 1, when an excessive power source potential exceeding the standard power source potential is supplied from outside, the operation becomes as follows. As mentioned above, when a supply voltage exceeding the standard power source potential is supplied to the semiconductor integrated circuit device, it is possible to induce gate oxide film breakdown or other trouble, but such high voltage may be effectively suppressed in the high voltage generation circuit in FIG. 1. This operation is explained in reference to FIGS. 1, 3 and 4. FIG. 3 is a timing chart showing voltage waveforms of nodes in FIG. 1 when an excessive supply voltage close to the maximum rated voltage is supplied. FIG. 4 is a circuit diagram for showing the operation of the inverter shown in FIG. 1.

First, the operation of the inverter is explained by referring to FIG. 4. As well known, an inverter is composed by connecting a P-channel type MOS transistor QP and an N-channel type MOS transistor QN between the power source potential Vcc and the grounding potential (0V). More practically, a load capacitor CR having a specific capacitance is connected between the output of each inverter and the ground. Supposing here that the potential of the input terminal $\phi1$ changes from high level to low level, the P-channel type MOS transistor QP is turned on, and the N-channel type MOS transistor QN is turned off, so that an electric current flows from the power source potential Vcc to the grounding potential through the P-channel type MOS transistor QP and the load capacitor CR. As a result, the current of the output terminal of the inverter i7 changes from low level to high level. The same works with the inverters i8, i9 (also i10–i12 as shown in FIG. 1), of the rear stage.

When an excessive supply voltage close to the maximum rated voltage is supplied to the high voltage generation circuit in FIG. 1, the power source potential is supplied to the power source terminals of the inverters i7 to i9 in FIG. 4. Since the value of the load capacitor CR is nearly constant, the current flowing in the P-channel type MOS transistor QP is greater when a potential higher than the power source potential Vcc is supplied than when an ordinary power source potential Vcc is supplied to the power source terminals of the inverters i7 to i9. As a result, the switching operation of the inverter i7 is accelerated, and the delay time by the inverter i7 is shortened. The same works with the inverters i8 to i12 (i10–i12 shown in FIG. 1) in the rear stage.

That is, in FIG. 1, when the power source potential becomes a high potential exceeding the standard supply potential Vcc, the potential of the input terminal $\phi 1$ changes from low level to high level, and the signals $\phi 2$ and $\phi 3$ change from high level to low level in a shorter time. (More specifically, ti' in FIG. 3 is shorter than t1 in FIG. 2.) As a result, the pulse width (t2' in FIG. 3) of the set signal $\phi 4$ in latch circuit 3 becomes shorter than the pulse width t2 in FIG. 2. When the pulse width t2 of the set signal $\phi 4$ becomes short, before the output signal $\phi 7$ of the NOR gate R2 of the latch circuit 3 changes from low level to high level as indicated by a broken line in FIG. 4, the potential of the output signal $\phi 6$ of the NOR gate R1 becomes high level as indicated by a solid line in FIG. 3. Accordingly, the output signal $\phi 7$ of the latch circuit 3 remains at low level as indicated by a solid line in FIG. 3. As a result, the MOS transistor Q5 is turned off, and the operation of the oscillation circuit 1 stops. Hence, the potential of the output terminal B is kept at a potential (Vcc - VTQ1), lower than the power source potential Vcc by the threshold voltage VTQ1 of the MOS transistor Q1 as indicated by a solid line in FIG. 3.

In this way, according to the embodiment shown in FIG. 1, when an excessive power source potential exceeding the standard power source potential is supplied from outside, it is possible to keep the potential of the output terminal B from becoming extremely high by stopping the action of the oscillation circuit 1 by making use of the output signal $\phi 7$ of the latch circuit 3. As a result, application of intense electric field in the gate oxide film or the like of the MOS transistor Q4 is suppressed, and breakdown of gate oxide film may be prevented securely.

Meanwhile, if the potential of the input terminal $\phi 1$ changes from high level to low level, since the delay time of inverters i7 to i12 is short, t3' and t4' in FIG. 3 are shorter than t3 and t4 in FIG. 2. However, as explained in relation to FIG. 2, the pulse width t4 of the reset signal $\phi 5$ of the latch circuit 3 is set wider than the pulse width t2 of the set signal $\phi 4$. Accordingly, the pulse width t4' of reset signal $\phi 5$ of FIG. 3 is narrower than t4 in FIG. 2, but it has a sufficient pulse width for resetting the latch circuit 3. Therefore, the latch circuit 3 is reset by the pulse (t4' in FIG. 3) of the reset signal $\phi 5$, and the output signal $\phi 7$ of the latch circuit 3 changes to low level.

Setting of the pulse width (t4 in FIG. 2, t4' in FIG. 3) of the reset signal $\phi 5$ of the latch circuit 3 wider than the pulse width (t2 in FIG. 2, t2' in FIG. 3) of the set signal $\phi 4$ is very effective for operating the high voltage generation circuit in FIG. 1 stably.

More specifically, if the power source potential changes to a value closer to the maximum rated voltage during the time when the input signal $\phi 1$ changes from low level to high level and then returns to low level, the pulse width (t4 in FIG. 2) of the reset signal $\phi 5$ is narrower than t4' in FIG. 3. Accordingly, if the pulse width (t4 in FIG. 2) of the reset signal $\phi 5$ is narrow when supplying the standard power source potential, the pulse width (t4' in FIG. 3) becomes extremely narrow when supplying an excessive power source potential, and thereby the latch circuit 3 is not always reset. If the latch circuit 3 cannot be reset (that is, if the output signal $\phi 7$ remains at high level), the oscillation circuit 1 continues to operate up to the next cycle, and the potential of the output terminal B becomes extremely high. In the embodiment shown in FIGS. 1 to 3, in order to solve such a problem the pulse widths t4, t4' of the reset signal $\phi 5$ are wider than the pulse widths t2, t2' of the set signal $\phi 4$, and even if the power source potential becomes high, it is designed to reset without fail when the potential of the input terminal $\phi 1$ changes from high level to low level.

Figure 5:
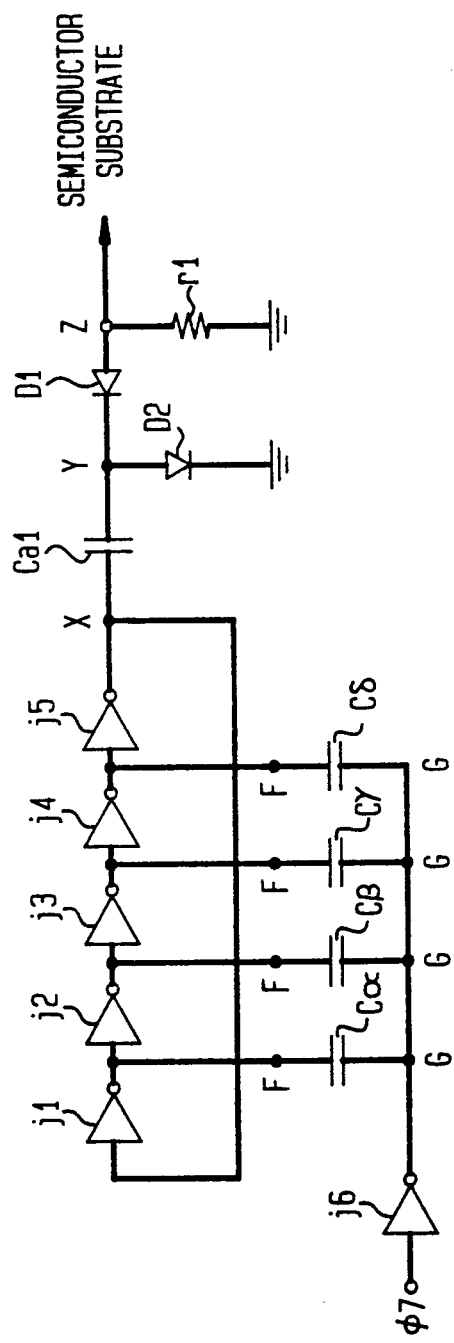
FIG. 5 is a circuit diagram of a semiconductor integrated circuit in a second embodiment of the invention.
Figure 6:
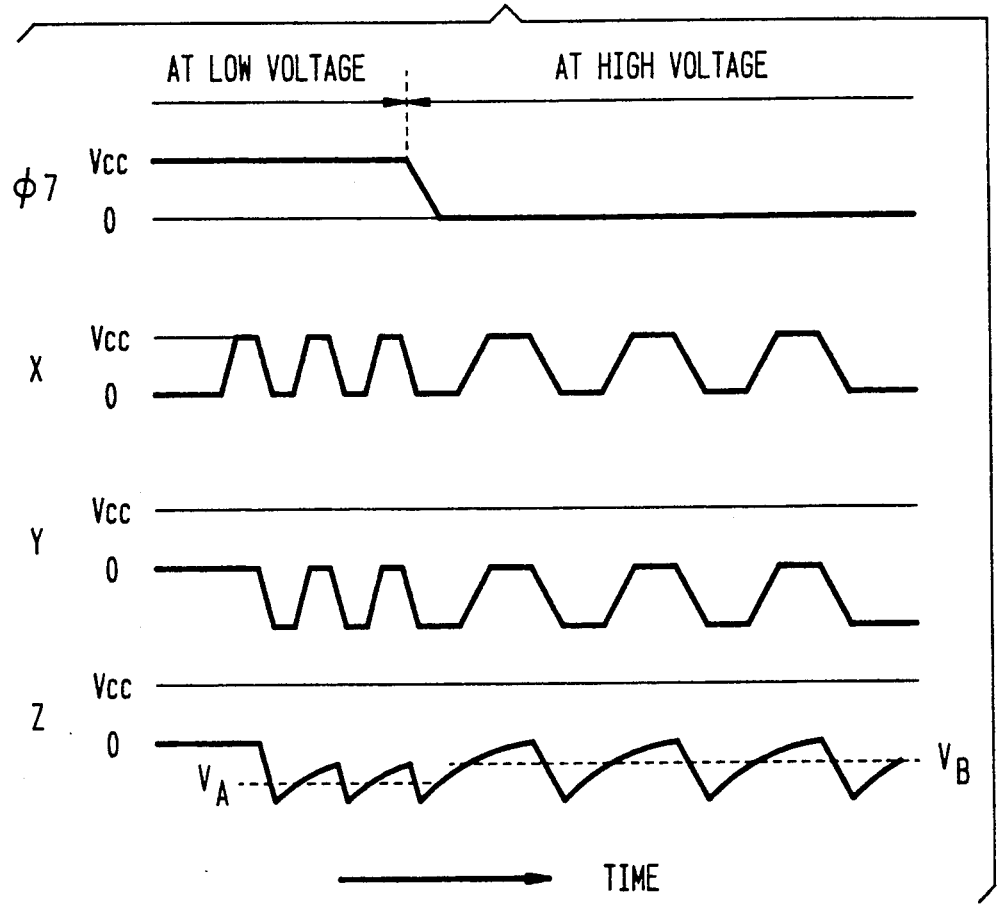
FIG. 6 is a timing chart showing voltage waveforms of nodes in FIG. 5.
Figure 7:
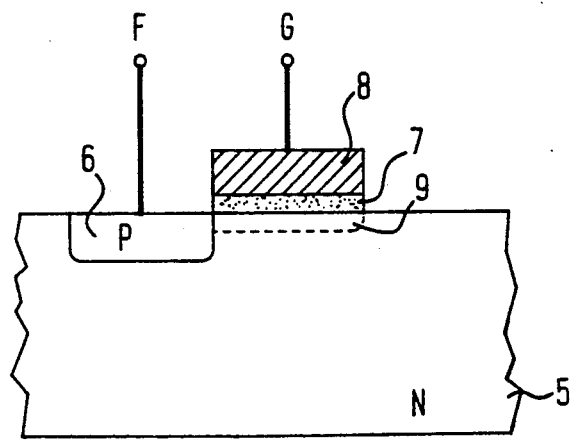
FIG. 7 is a sectional view showing the structure of an enhancement type MOS capacitor.

FIG. 5 is a circuit diagram showing a semiconductor integrated circuit device in a second embodiment. This is to show a substrate voltage generation circuit for generating a voltage lower than the grounding potential. FIG. 6 is a timing chart showing voltage waveforms of nodes in FIG. 5. FIG. 7 is a sectional view schematically showing the structure of an enhancement type MOS capacitor in FIG. 5.

The operation is described below while referring to FIGS. 5 to 7.

In FIG. 5, loop-connected inverters j1 to j5 compose a self-excited oscillation circuit. One end, F, of enhancement type MOS capacitors $C\alpha$ to $C\delta$ is connected to the output terminal of each one of inverters j1 to j4. On the other hand, the output signal $\phi 7$ of the latch circuit 3 in FIG. 1 is supplied to the input terminal $\phi 7$. The signal $\phi 7$ is once inverted by the inverter j6, and is supplied to the other end, G, of the enhancement type MOS capacitors $C\alpha$ to $C\delta$.

The enhancement type MOS capacitors $C\alpha$ to $C\delta$ are composed as shown in FIG. 7. In FIG. 7, a P-type impurity diffusion region 6 is formed in the surface region of the N-type semiconductor substrate 5, and the MOS capacitor is formed by the PN junction. On the surface of the semiconductor substrate 5, adjacent to the impurity diffusion region 6, the gate oxide film 7 and gate electrode 8 are formed. The one terminal F of MOS capacitor is connected to the impurity diffusion region 6, while the other terminal G is connected to the gate electrode 8.

Supposing here that the terminal G is at the grounding potential (0V), the region 9 immediately beneath the gate oxide film 7 and the impurity diffusion region 6 do not conduct electrically, hence not acting as a capacitor. On the other hand, when a power source potential (Vcc) is supplied to the terminal G, the region 9 immediately beneath the gate oxide film 7 and the impurity diffusion region 6 conduct electrically from each other. In consequence, a specific capacitance is formed and connected between the terminals F and G. When a potential higher than the standard power source potential (Vcc) is applied to the terminal G, the value of capacitance increases accordingly.

The embodiment in FIG. 5 is intended to suppress generation of excessively low voltage, by using such enhancement type MOS capacitors Cα to Cδ and varying the oscillation frequency depending on the supply voltage.

Figure 15:
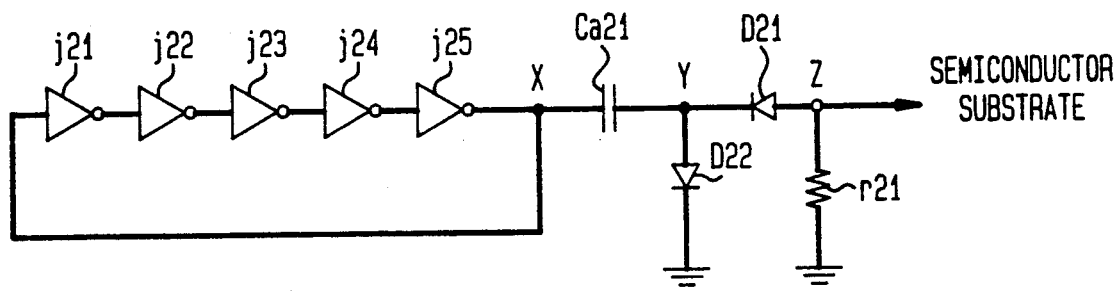
FIG. 15 is a circuit diagram showing another conventional semiconductor integrated circuit.
Figure 16:
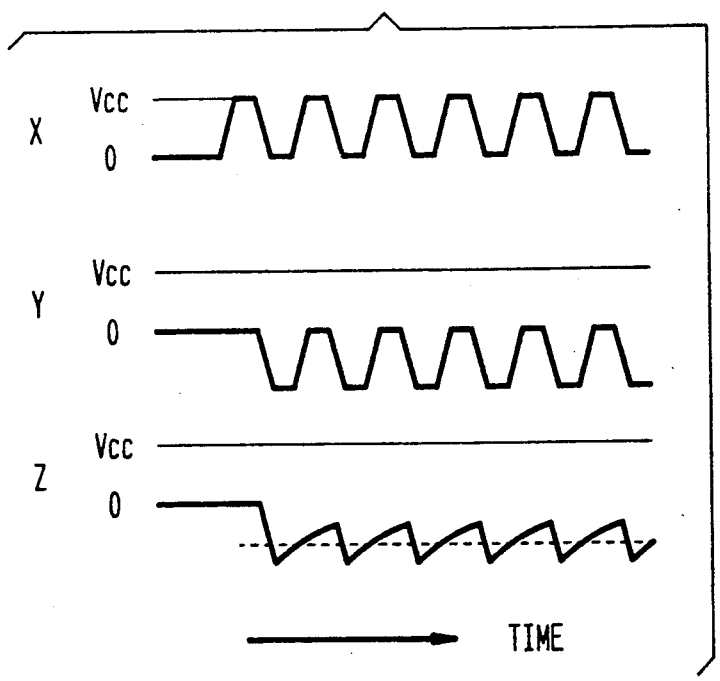
FIG. 16 is a timing chart showing voltage waveforms of nodes in FIG. 15.

In other words, while operating at low power source potential, the output signal $\phi 7$ of the latch circuit 3 in FIG. 1 is a high level. Accordingly, a potential of low level (0V) is supplied to the terminal G of the enhancement type MOS capacitors Cα to Cδ. Therefore, the MOS capacitors Cα to Cδ do not function as capacitors. As a result, the oscillation output of the pulse width determined by the sum of delay times of the inverters j1 to j5 as shown in the left half of FIG. 6 is obtained at the node X. By this oscillation output, the charge pump composed of capacitor Ca1 and diodes D1, D2 is pumped up, and an average voltage VA which is lower than the grounding potential is obtained at the node Z same as in the prior art shown in FIG. 15. This average voltage VA is supplied to the semiconductor substrate as the substrate voltage.

On the other hand, when an excessive high voltage over the power source potential is supplied, as explained in FIG. 3, the output signal $\phi 7$ of the latch circuit 3 remains at low level. Accordingly, a potential of high level is supplied to one end G of the MOS capacitors Cα to Cδ in FIG. 5. In consequence, the region 9 immediately beneath the gate oxide film 7 and the impurity diffusion region 6 in FIG. 7 are electrically conducted away (that is, become depressed) so as to create a specified capacitance value. When the MOS capacitors Cα to Cδ come to have capacitance, the delay time of the inverters j1 to j5 become longer. As a result, the pulse width of the oscillation output appearing in node X becomes wide as shown in the right half of FIG. 6, and thereby the oscillation frequency drops. As the oscillation frequency is lowered, the voltage lowering ability of the charge pump becomes weak, and the potential at node Z becomes a higher average voltage VB than the previous average voltage VA. Such a higher average voltage VB is supplied to the semiconductor substrate as the substrate voltage.

Thus, according to the embodiment in FIG. 5, when an excessive high voltage over the standard power source potential is supplied from outside, excessive lowering of the substrate potential may be automatically suppressed. Therefore, breakdown of oxide film due to application of excessive low voltage to the semiconductor substrate may be securely prevented.

Meanwhile, the capacitance value of the enhancement type MOS capacitor is varied depending on the amplitude of the potential supplied to the gate electrode 8. Accordingly, the higher the supplied power source potential, the larger the capacitance value becomes, and hence the oscillation frequency drops, and the substrate voltage approaches the grounding potential (0V). Therefore, according to the embodiment in FIG. 5, depending on the amplitude of the power source potential being supplied, an optimum substrate voltage may be always generated automatically.

Figure 8:
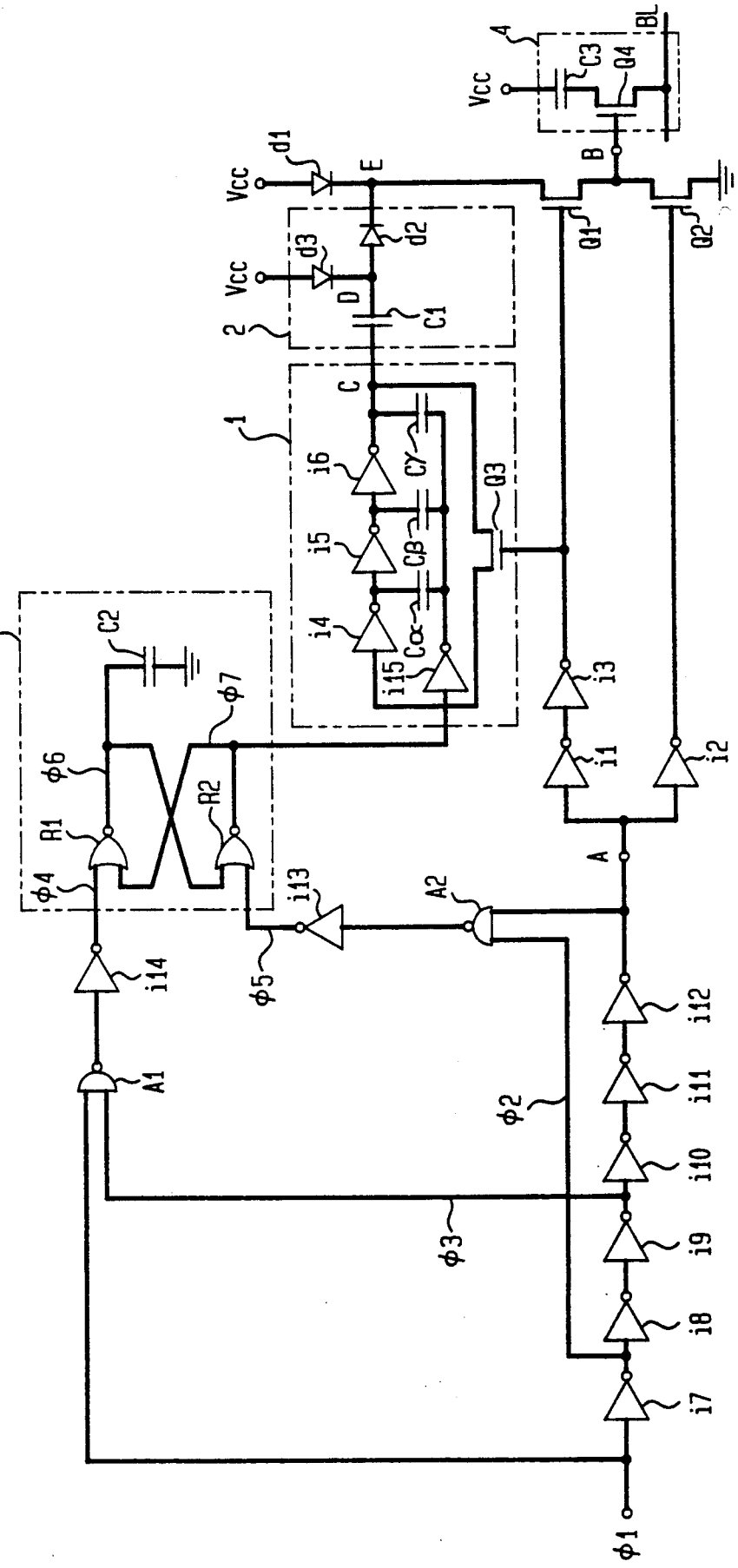
FIG. 8 is a circuit diagram of a semiconductor integrated circuit in a third embodiment of the invention; integrated circuit in a fourth embodiment of the invention.

FIG. 8 shows a semiconductor integrated circuit according to a third embodiment of the invention, specifically illustrating a circuit for generating a high voltage exceeding the power source potential (Vcc). In the embodiment in FIG. 8, only the composition of the oscillation circuit 1 is different from the embodiment in FIG. 1. In FIG. 8, one end of each one of enhancement type MOS capacitors Cα, Cβ, Cγ is connected to the output terminal of each one of inverters i4 to i6, and the output signal $\phi 7$ of the latch circuit 3 is supplied to the other end of each one of MOS capacitors Cα, Cβ, Cγ through the inverter i15.

When thus composed, when an excessive power source potential close to the maximum rated voltage is supplied from outside, the output signal $\phi 7$ of the latch circuit 3 becomes low level, and the capacitance of the enhancement type MOS capacitors Cα, Cβ, Cγ increases. As a result, the oscillation frequency of the oscillation circuit 1 drops, and the potential of the output terminal B is kept from becoming extremely high.

Figure 9:
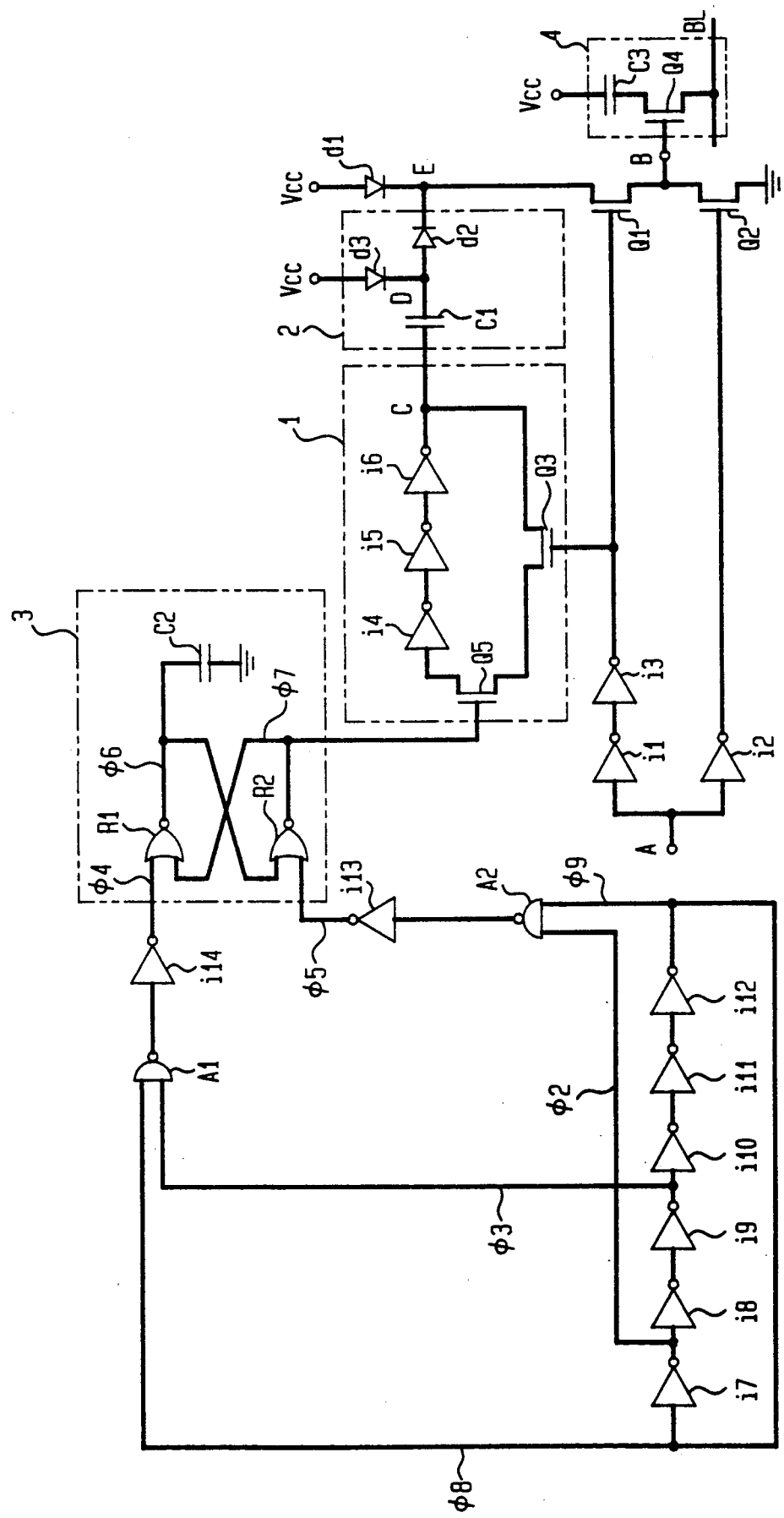

FIG. 9 shows a semiconductor integrated circuit in a fourth embodiment of the invention, specifically illustrating a circuit for generating a high voltage exceeding a power source potential (Vcc). In the embodiment in FIG. 9, the manner of supplying input signals is different from the embodiment in FIG. 1. In FIG. 9, inverters i7 to i12 are loop-connected to compose a self-excited oscillation circuit. Accordingly, $\overline{RAS}$ or a clock signal called chip enable signal is directly supplied to the input terminal A.

In FIG. 9, when the power source potential becomes high, the switching speed of the inverters i7 to i12 becomes faster (the delay time becomes shorter) and the oscillation frequency becomes high. Accordingly, the time difference of the internal signals $\phi 8$, $\phi 3$, $\phi 2$, $\phi 9$ becomes small, and the output signal $\phi 7$ of the latch circuit 3 remains at low level. As a result, the oscillation circuit 1 stops, thereby preventing the power source potential from becoming too high.

Figure 10:
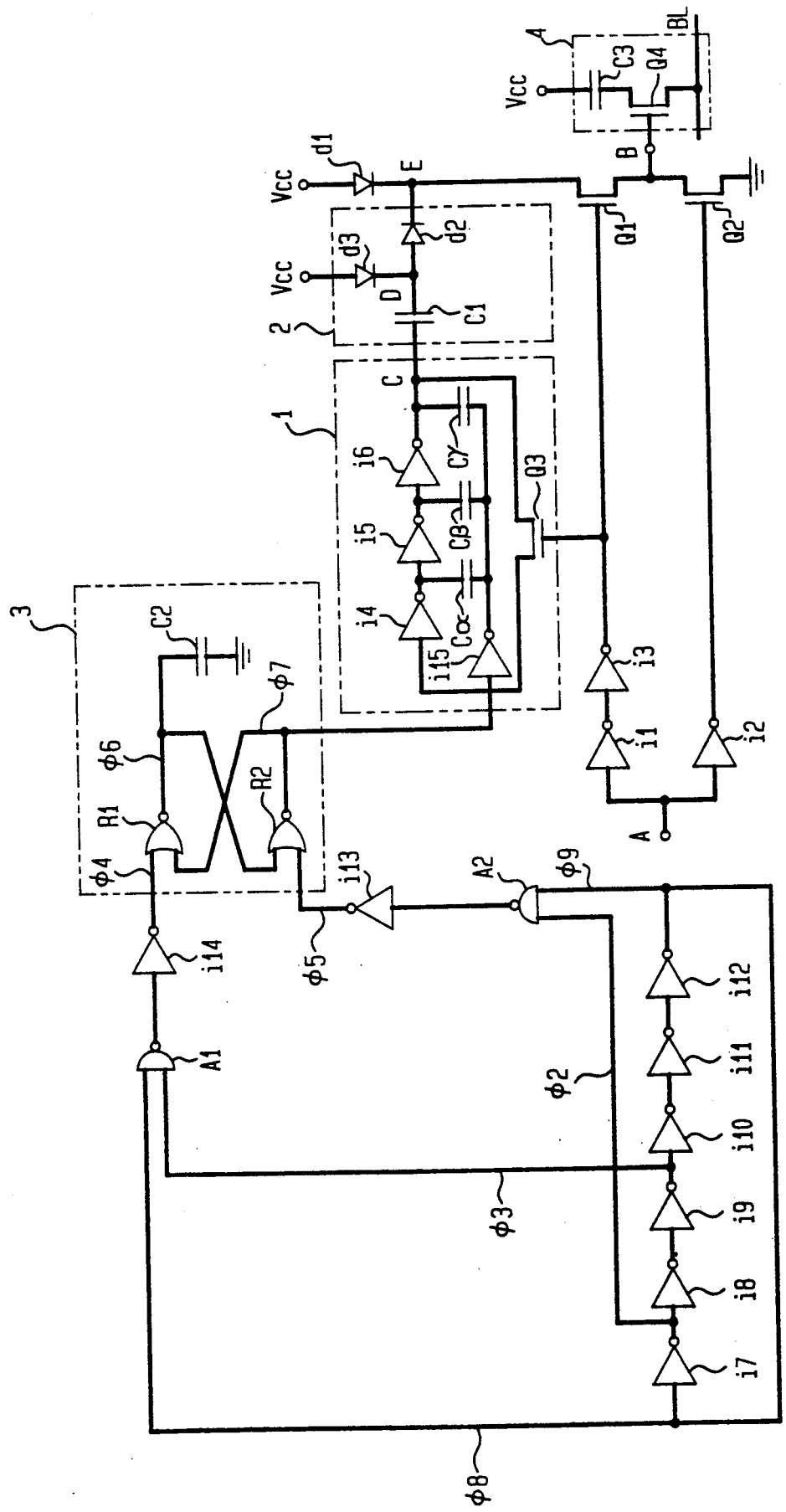
FIG. 10 is a circuit diagram of a semiconductor integrated circuit in a fifth embodiment of the invention.

FIG. 10 shows a semiconductor integrated circuit in a fifth embodiment of the invention, which is a combination of the embodiment in FIG. 8 and the embodiment in FIG. 9. In this constitution, too, the same objects of the invention are achieved.

Figure 11:
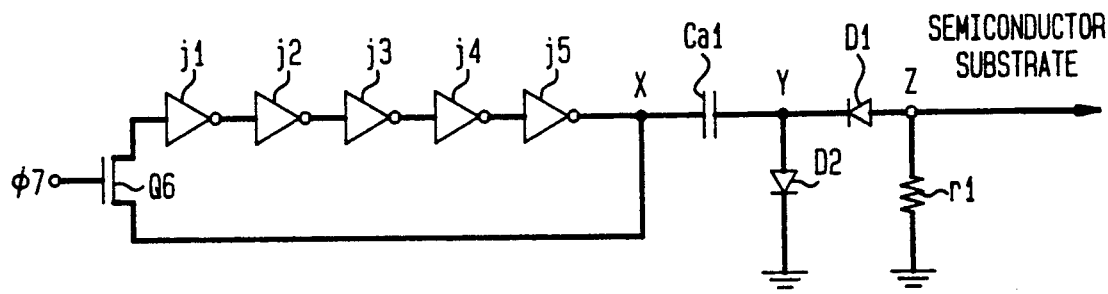
FIG. 11 is a circuit diagram of a semiconductor integrated circuit in a sixth embodiment of the invention.
Figure 12:
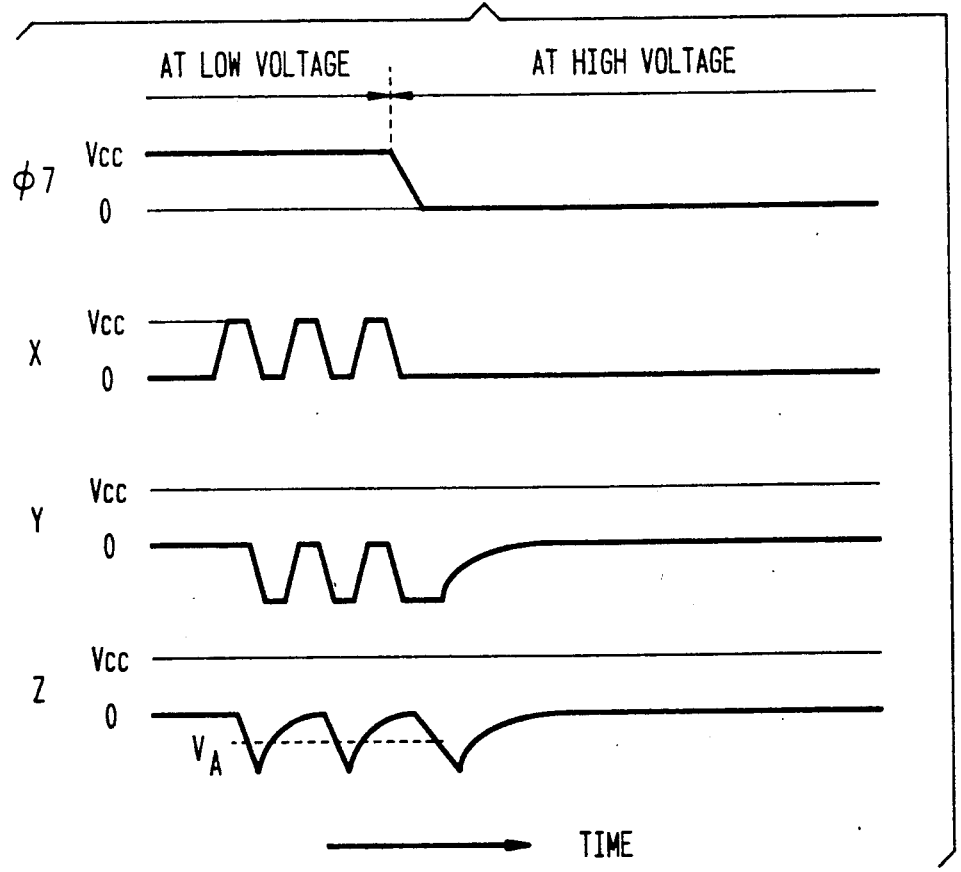
FIG. 12 is a timing chart showing voltage waveforms of nodes in FIG. 11.

FIG. 11 shows a semiconductor integrated circuit in a sixth embodiment of the invention, specifically illustrating the circuit for generating a lower substrate voltage than the grounding potential. FIG. 12 is a timing chart showing the voltage waveforms of the nodes in FIG. 11.

In the embodiment in FIG. 11, MOS transistor Q6 is connected to a part of the oscillation circuit composed of inverters j1 to j5, and output signal $\phi 7$ of the latch circuit 3 shown in FIG. 1 is supplied to the gate electrode of the MOS transistor Q6.

In FIG. 11, while the power source potential is low, the output signal $\phi 7$ is at high level, and the MOS transistor Q6 is turned on, and therefore the oscillation circuit operates, and the average voltage VA appears in the node Z as shown in the left half of FIG. 12.

On the other hand, when the power source potential become high, the output signal $\phi 7$ remains at low level. Accordingly, the MOS transistor Q6 is turned off, and the oscillation circuit stops. As a result, the potential of the node Z becomes the grounding potential (0V), thereby preventing an excessively low voltage from supplying the semiconductor substrate.

The foregoing embodiments are examples of memory circuits, but, needless to say, the invention may be applied to semiconductor integrated circuits other than memory circuits.

We claim:
1. A semiconductor integrated circuit comprising:
   first circuit means for generating a voltage exceeding a voltage range between a power source potential and a grounding potential;

internal signal generating means for generating plural internal signals, said plural internal signals having mutual transition timings with a time difference which decreases as the difference of the externally supplied power source potential and grounding potential increases; and second circuit means for decreasing an absolute value of the voltage generated by said first circuit means by using said plural internal signals.

2. A semiconductor integrated circuit of claim 1, wherein said first circuit means comprises:

first means for generating two potential states (a) and (b), that is, (a) said grounding potential or a first potential close to said grounding potential between said grounding potential and said power source potential, and (b) said power source potential or a second potential close to said power source potential between said grounding potential said the power source potential, and second means for generating a potential exceeding the power source potential in the state where said first means generates said second potential.

3. A semiconductor integrated circuit of claim 2, wherein said first means is composed of an oscillation circuit and a charge pump circuit driven by said oscillation circuit, and said second circuit means is composed of either one of a means for stopping said oscillation circuit or the means for lowering a oscillation frequency of said oscillation circuit.

4. A semiconductor integrated circuit of claim 1, wherein:

said first circuit means is composed of an oscillation circuit and a charge pump circuit driven by said oscillation circuit; and said second circuit means is composed of means for stopping said oscillation circuit.

5. A semiconductor integrated circuit of claim 1, wherein:

said first circuit means is composed of an oscillation circuit and a charge pump circuit driven by said oscillation circuit; and means for lowering the oscillation frequency of said oscillation circuit.

6. A semiconductor integrated circuit of wherein said internal signal generating means is composed of cascade-connected plural inverters and a clock signal supplied to the input terminal of an inverter of a first stage of said cascade-connected plural inverters and output signals of a second and subsequent inverters of said cascade-connected plural inverters are used as said internal signals.

7. A semiconductor integrated circuit of wherein said internal signal generating means is composed of a plurality of inverters, said inverters having output signals used as said internal signals.

8. A semiconductor integrated circuit of claim 3, wherein said means for lowering the oscillation frequency of said oscillation circuit comprises:

an oscillation circuit composed of loop-connected plural inverters having output terminals;

plural enhancement type MOS capacitors, each having first and second connection ends, said first connection ends connected to the output terminals of said loop-connected plural inverters respectively; and means for controlling the capacitance of said plural enhancement type MOS capacitors by supplying a control voltage to said second connection ends of said plural enhancement type MOS capacitors.

9. A semiconductor integrated circuit of claim 5, wherein said means for lowering the oscillation frequency of said oscillation circuit comprises:

an oscillation circuit having loop-connected plural inverters;

plural enhancement type MOS capacitors, each having first and second connection ends, said first connection ends connected to the output terminals of said loop-connected plural inverters respectively; and means for controlling the capacitance of said plural enhancement type MOS capacitors by supplying a control voltage to said second connection ends of said plural enhancement type MOS capacitors.

10. A semiconductor integrated circuit comprising:

high voltage generating means for generating a high voltage exceeding a power source potential, comprising an oscillation circuit and a charge pump circuit driven by said oscillation circuit;

internal signal generating means for generating plural internal signals to decrease a time difference of mutual transition timings among said plural internal signals when an excessive power source potential exceeding a standard power source potential is supplied from an outside source, said plural internal signals each having a pulse width;

a latch circuit which outputs a signal and which is set and reset by said plural internal signals when said standard power source potential is supplied from said outside source, and is reset only by said plural internal signals when an excessive power source potential exceeding said standard power source potential is supplied from said outside source; and means for stopping said oscillation circuit by the output signal of said latch circuit.

11. A semiconductor integrated circuit comprising:

high voltage generating means for ,, generating a high voltage exceeding a power source potential, comprising an oscillation circuit and a charge pump circuit driven by said oscillation circuit;

internal signal generating means for generating plural internal signals to decrease a time difference of mutual transition timings among said plural internal signals when an excessive power source potential exceeding a standard power source potential is supplied from an outside source, said plural internal signals each having a pulse width;

a latch circuit which outputs a signal and which is set and reset by said plural internal signals when said standard power source potential is supplied from said outside source, and is reset only by said plural internal signals when an excessive power source potential exceeding said standard power source potential is supplied from said outside source; and means for lowering the oscillation frequency of said oscillation circuit by the output signal of said latch circuit.

12. A semiconductor integrated circuit of claim 10, wherein the pulse width of the reset signal of said latch circuit is set wider than the pulse width of the set signal of said latch circuit.

13. A semiconductor integrated circuit of claim 11, wherein the pulse width of the reset signal of said latch circuit is set wider than the pulse width of the set signal of said latch circuit.

14. A semiconductor integrated circuit comprising:

substrate voltage generating means for generating a low voltage exceeding a grounding potential, comprising an oscillation circuit and a charge pump circuit driven by said oscillation circuit;

internal signal generating means for generating plural internal signals to decrease a time difference of mutual transition timings among said plural internal signals when an excessive power source potential exceeding a standard power source potential is supplied from an outside source, said plural internal signals each having a pulse width;

a latch circuit which outputs a signal and which is set and reset by said plural internal signals when said standard power source potential is supplied from said outside source, and is reset only by said plural internal signals when an excessive power source potential exceeding said standard power source potential is supplied from said outside source; and means for stopping said oscillation circuit by the output signal of said latch circuit.

15. A semiconductor integrated circuit comprising:

substrate voltage generating means for generating a low voltage exceeding a grounding potential, comprising an oscillation circuit and a charge pump circuit driven by said oscillation circuit;

internal signal generating means for generating plural internal signals to decrease a time difference of mutual transition timings among said plural internal signals when an excessive power source potential exceeding a standard power source potential is supplied from an outside source, said plural internal signals each having a pulse width;

a latch circuit which outputs a signal and which is set and reset by said plural internal signals when said standard power source potential is supplied from said outside source, and is reset only by said plural internal signals when an excessive power source potential exceeding said standard power source potential is supplied from said outside source; and means for lowering the oscillation frequency of said oscillation circuit by the output signal of said latch circuit.

16. A semiconductor integrated circuit of claim 14, wherein the pulse width of the reset signal of said latch circuit is set wider than the pulse width of the set signal of said latch circuit.

17. A semiconductor integrated circuit of claim 15, wherein the pulse width of the reset signal of said latch circuit is set wider than the pulse width of the set signal of said latch circuit.

18. A semiconductor integrated circuit comprising:

high voltage generating means for generating a high voltage exceeding a power source potential, comprising a first oscillation circuit and a first charge pump circuit driven by said first oscillation circuit;

substrate voltage generating means for generating a low voltage exceeding a grounding potential, comprising a second oscillation circuit and a second charge pump driven by said second oscillation circuit;

internal signal generating means for generating plural internal signals to decrease a time difference of mutual transition timings of said plural internal signals when an excessive power source potential exceeding a standard power source potential is supplied from an outside source, said plural internal signals each having a pulse width;

a latch circuit which is set and reset by said plural internal signals when said standard power source potential is supplied from said outside source, and is reset only by said plural internal signals when an excessive power source potential exceeding said standard power source potential is supplied from an outside source; and means for stopping said high voltage generating means and said substrate voltage generating means by the output signal of said latch circuit.

19. A semiconductor integrated circuit comprising:

high voltage generating means for generating a high voltage exceeding a power source potential, comprising a first oscillation circuit and a first charge pump circuit driven by said first oscillation circuit;

substrate voltage generating means for generating a low voltage exceeding a grounding potential, comprising a second oscillation circuit and a second charge pump driven by said second oscillation circuit;

internal signal generating means for generating plural internal signals to decrease a time difference of mutual transition timings of said plural internal signals when an excessive power source potential exceeding a standard power source potential is supplied from an outside source, said plural internal signals each having a pulse width;

a latch circuit which is set and reset by said plural internal signals when said standard power source potential is supplied from said outside source, and is reset only by said plural internal signals when an excessive power source potential exceeding said standard power source potential is supplied from an outside source; and means for lowering the oscillation frequency of said oscillation circuit by the output signal of said latch circuit.

20. A semiconductor integrated circuit of claim 18, wherein the pulse width of the reset signal of said latch circuit is set wider than the pulse width of the set signal of said latch circuit.

21. A semiconductor integrated circuit of claim 19, wherein the pulse width of the reset signal of said latch circuit is set wider than the pulse width of the set signal of said latch circuit.

* * * * *

UNITED STATES PATENT AND TRADEMARK OFFICE
CERTIFICATE OF CORRECTION

PATENT NO. : 5,124,574
DATED : June 23, 1992
INVENTOR(S) : Akira Ibaraki

It is certified that error appears in the above-indentified patent and that said Letters Patent is hereby corrected as shown below:

```
Column 11, line 29 (Claim 3), delete "the" and
          insert --a--.
Column 11, line 45 (Claim 6), after "of" insert
          --claim 1--.
Column 11, line 48 (Claim 6), delete "the" and insert
          --an--.
Column 11, line 48 (Claim 6), delete "an" and insert
          --the--.
Column 11, line 53 (Claim 7), after "of" insert
          --claim 1--.
Column 12, line 39 (Claim 11), after "for" delete ",,".
```

Signed and Sealed this

Nineteenth Day of October, 1993

Attest:

BRUCE LEHMAN

*Attesting Officer*     *Commissioner of Patents and Trademarks*